(12) United States Patent
Posey et al.

(10) Patent No.: US 7,417,449 B1
(45) Date of Patent: Aug. 26, 2008

(54) WAFER STAGE STORAGE STRUCTURE SPEED TESTING

(75) Inventors: Randal L. Posey, Austin, TX (US); Michael K. Ciraula, Round Rock, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 163 days.

(21) Appl. No.: 11/274,595

(22) Filed: Nov. 15, 2005

(51) Int. Cl.
*G01R 31/02* (2006.01)

(52) U.S. Cl. ........................ 324/763; 324/759; 714/733
(58) Field of Classification Search ........................ None
See application file for complete search history.

(56) References Cited

U.S. PATENT DOCUMENTS

| | | | |
|---|---|---|---|
| 5,095,267 A * | 3/1992 | Merrill et al. ................ | 324/763 |
| 5,617,531 A * | 4/1997 | Crouch et al. ................. | 714/30 |
| 5,838,163 A * | 11/1998 | Rostoker et al. ............. | 324/763 |
| 6,014,336 A * | 1/2000 | Powell et al. ................ | 365/201 |
| 6,046,600 A * | 4/2000 | Whetsel ....................... | 324/763 |
| 6,219,813 B1 * | 4/2001 | Bishop et al. ................ | 714/736 |
| 6,323,664 B1 * | 11/2001 | Kim et al. .................... | 324/754 |
| 6,400,173 B1 * | 6/2002 | Shimizu et al. ............. | 324/765 |
| 6,489,819 B1 * | 12/2002 | Kono et al. .................. | 327/141 |
| 6,631,086 B1 * | 10/2003 | Bill et al. ................ | 365/185.09 |
| 6,785,173 B2 * | 8/2004 | Sohn et al. .................. | 365/201 |
| 7,183,788 B2 * | 2/2007 | Moore ......................... | 324/765 |
| 2004/0103355 A1 * | 5/2004 | Correale et al. ............. | 714/733 |
| 2004/0260975 A1 * | 12/2004 | Nagura ........................ | 714/30 |
| 2005/0030055 A1 * | 2/2005 | Tran et al. .................... | 324/763 |
| 2006/0206771 A1 * | 9/2006 | Tseng et al. ................. | 714/733 |

* cited by examiner

*Primary Examiner*—Ha Nguyen
*Assistant Examiner*—Richard Isla-Rodas
(74) *Attorney, Agent, or Firm*—Meyertons Hood Kivlin Kowert & Goetzel, P.C.; Stephen J. Curran

(57) ABSTRACT

A system for testing integrated circuit storage structures on a semiconductor wafer. A test IC manufactured on a semiconductor wafer includes a test storage structure such as a random access memory structure, for example, and an access controller including one or more clock sources. In various embodiments, the clock sources may include a ring oscillator and a pulse width generator. These clock sources may be programmable to provide a clock signal having a variety of frequencies for accessing the storage structure. In one embodiment, the frequencies provided by the access controller may be higher than a frequency that can be supplied to the wafer from ATE. In another embodiment, the pulse width generator may be programmable to provide a pulse train having a variety of duty cycles.

16 Claims, 4 Drawing Sheets

WAFER STAGE STORAGE STRUCTURE SPEED TESTING

BACKGROUND OF THE INVENTION

1. Field of the Invention

This invention is related to the field of integrated circuits, and more particularly, to testing storage structures of integrated circuits.

2. Description of the Related Art

The adherence of the development of integrated circuit technology to Moore's Law over the past few decades has led to the capacity to fabricate highly complex integrated circuits (IC) including tens of millions of transistors on a single die. With wafer size increasing to 300 mm and beyond, the number of ICs that can be manufactured on a single wafer may range from hundreds to thousands. Therefore each processed wafer represents a substantial value in terms of potentially saleable finished product.

ICs on processed wafers are typically tested for both functionality and performance. During functional testing, if a particular IC is determined at this stage to be non-functional, then when the wafer is sawn into individual die, the die including that IC may be discarded thus avoiding the cost associated with attaching it to a lead frame, wire bonding, and packaging. Performance testing at the wafer stage may indicate that ICs formed on different parts of the wafer have different maximum operating speeds. Performance differences may be due to variations in process, mask alignment inaccuracies, and other manufacturing variables. The die may be sorted by operating speed and packaged/sold accordingly.

Another reason for wafer stage testing of ICs is to determine yield for feedback used in controlling the manufacturing process. The chemical and mechanical processes used in the manufacture of an IC wafer are numerous and may be prone to deviation from nominal. Typically, several layers are deposited on/in the surface of the wafer by thermal growth, chemical vapor deposition, photolithography, ion implantation and other methods. The results of thermal growth and chemical vapor deposition processes may be adversely affected by variations in the wafer's environment during processing. Fluctuations in oven temperature or the chemical composition of the atmosphere to which the wafer is exposed may produce ICs that are non-functional or that do not operate at frequencies as high as specified.

Processes that involve masking portions of the wafer such as photolithography, ion implantation, etc. may be susceptible to problems caused by mask misalignment, improper beam angle, variations in smoothness/flatness of the wafer surface etc. Variations in the parameters of these types of processes may result in ICs manufactured on one portion of the wafer having different operational characteristics from those manufactured on a different portion of the wafer. For example, a slight rotational mask misalignment may result in fully functional ICs being produced in and around the center of the wafer, while non-functional or severely degraded circuits are formed near the wafer's edge.

Since changes in process parameters may occur at any time during the manufacturing process it may be important to perform wafer stage testing periodically to discover the effects of such changes in a timely fashion. A wafer probe may be used to contact multiple probe points manufactured on the wafer expressly for this purpose. Automated test equipment (ATE) may provide signals to and receive signals from ICs on the wafer through one or more probes. In a typical test environment using the wafer probe, the ATE may provide stimulus in the form of clock signals and data to the ICs on the wafer. In addition, the ATE may receive results from the ICs. Since the signals produced by the ATE must typically travel several feet from the point at which they are generated to the point at which they enter the wafer, there may be a physical limit on the frequency of the signals that can be supplied to the ICs using this methodology. For example, high speed ICs may be designed to operate at clock frequencies of tens of Gigahertz or more. Many types of ATE may not be capable of supplying signals of these frequencies to a wafer. Therefore, usual practice may be to perform wafer stage testing at frequencies, which the ATE is capable of supplying and which may be significantly lower than the specified operating frequency of the ICs. This type of testing may be inadequate to discover problems at the various process corners.

SUMMARY

Various embodiments of a method and system for testing integrated circuit storage structures on a semiconductor wafer are disclosed. According to one embodiment, a test IC is manufactured on a semiconductor wafer. The test IC includes a test storage structure such as random access memory (RAM) structures, for example, and an access controller including one or more clock sources. In various embodiments, the clock sources may include a ring oscillator and a pulse width generator. These clock sources may be programmable to provide a clock signal having a variety of frequencies for accessing the storage structure. In one embodiment, the frequencies provided by the access controller may be higher than a frequency that can be supplied to the wafer from ATE. In another embodiment, the pulse width generator may be programmable to provide a pulse train having a variety of duty cycles. In one specific implementation, the access controller may receive data and address information from the ATE and may provide this information along with a clock signal from the selected clock source to the test storage structure in order to perform an access test on the test storage structure.

BRIEF DESCRIPTION OF THE DRAWINGS

A better understanding of the present invention can be obtained when the following detailed description is considered in conjunction with the following drawings.

Figure 1:
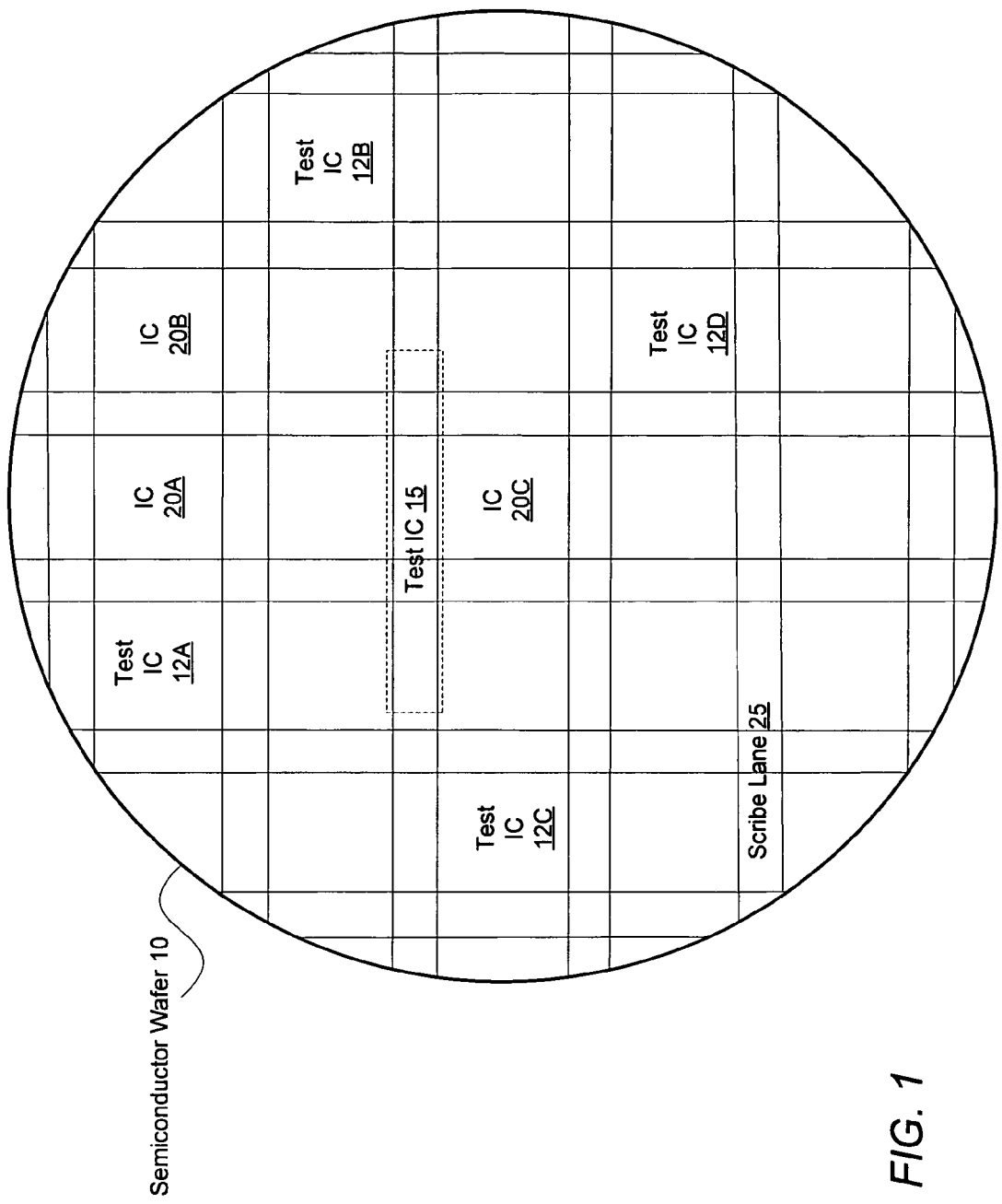
FIG. 1 is a drawing of a semiconductor wafer including one embodiment of a test integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must).

DETAILED DESCRIPTION OF EMBODIMENTS

Testing the functionality of the ICs at the wafer stage may be advantageous for a variety of reasons, which will be detailed below. As described above in many cases multiple probe points may be formed on the surface of the wafer to facilitate connection of ATE. To reliably contact a probe to a probe pad, a square probe pad may need to be seventy-five microns on a side or larger. With microprocessor technology approaching the 0.1-micron range, a single probe pad may occupy the same chip area as tens of thousands of transistors. The area required for probe pads may be intolerable in some highly complex integrated circuits. However, as an alternative to incorporating probe pads into an IC design, test ICs may be manufactured on the semiconductor wafer alongside the product ICs.

Turning now to FIG. 1, a semiconductor wafer including an embodiment of a test integrated circuit is shown. Semiconductor wafer 10 includes a number of ICs such as IC 20A-20C for example. In addition, semiconductor wafer 10 includes a number of test ICs designated test IC 12A-12D. Likewise, semiconductor wafer 10 includes a test IC 15. As shown, the individual ICs are separated by areas called scribe lanes or scribe channels such as scribe lane 25, for example. The areas between the scribe lanes represent positions at which additional ICs may be manufactured on the wafer. For example, in one embodiment, ICs 20A-20C may be produced as state of the art microprocessors whose dimensions approximate fifteen millimeters on a side. With a wafer diameter of three hundred millimeters, there may be several hundred IC sites on a single wafer. It is noted that the components having a number followed by a letter may be referred to by the number alone where appropriate for simplicity.

In one embodiment, the test ICs 12 may be manufactured in positions that would otherwise contain a product IC such as IC 20A, for example. In another embodiment, the test ICs (e.g. test IC 15) may be manufactured in the area between IC positions. The area between two adjacent IC positions is commonly referred to as a scribe channel or a scribe lane. The scribe channels may be used to reserve space that may be wholly or partially consumed during the process of separating the individual die from the wafer. For example, if this separation process is performed using a saw, the scribe channel may be at least as wide as the kerf of the saw being used. Using 0.1-micron technology and assuming a 100 to 200 micron scribe channel width, it is apparent that quite complex test ICs may be manufactured in this area. Accordingly, test ICs in the scribe lanes may perform their function during the wafer stage and be destroyed during subsequent processing that precedes packaging of the die.

As mentioned previously, the reasons for testing IC functionality at the wafer stage may be varied. ICs determined to be non-functional at this stage may be discarded to avoid the cost associated with attaching them to lead frames, wire bonding, packaging and other finishing processes. Performance testing at the wafer stage may allow the die to be sorted by operating speed and packaged/sold accordingly. Wafer stage performance testing may also be used as an indication of variances in manufacturing processes (i.e. operation at process corners). Process variations that may impact final product performance may include, for example, changes in oven temperature, changes in the chemical composition of the atmosphere to which the wafer is exposed, mask misalignment, improper beam angle, and variations in smoothness/flatness of the wafer surface. Some of these variables may affect the functionality of all ICs on a wafer, while others may cause problems with a specific group of circuits. For example, the effects of rotational mask alignment problems may be insignificant for those chips manufactured in the center of the wafer, but may become progressively more pronounced with the radial distance of an ICs position to the point that those ICs manufactured near the edge of the wafer may be completely non-functional.

In addition, RAM structures, and particularly static RAM (SRAM) structures may make up a large portion of the total die area of many ICs. The SRAM structures are usually completely wired up and functional by the forth metal layer, for example. In conventional processes, the wired up SRAM devices may not be tested until the entire IC is complete for various reasons including: no separate test interface and the signals needed to control the SRAM may be generated in other parts of the IC and these signals may not be wired to the SRAM before the final metal layer. For example, the clock input to the SRAM may typically be generated by a PLL and distributed across the IC by a clock tree on the top layers of metal.

ICs are typically manufactured in an assembly line or pipelined fashion. If a process excursion happens at an early stage of the process, such as may occur if a tool involved in the manufacturing process goes out of calibration, and goes undetected until the product reaches more advanced stages, all of the product in the manufacturing pipeline between stages may be at risk for reduced or zero yield. Thus it may be desirable to detect process excursions and the associated problems and defects as early in the manufacturing process as possible.

Therefore, test ICs may be manufactured in various locations across the wafer to expose them to as many process variations as possible. In one embodiment, the locations for the test ICs may be positions that may otherwise contain a product IC. In other embodiments, the test ICs may be manufactured in the wafer's scribe channels. In yet another embodiment, a portion of the wafer's test ICs may be located in scribe lanes or channels, and the remainder in positions that would otherwise contain product ICs. It is noted that results obtained from wafer stage performance testing on a test IC in a particular location may be indicative of the performance of product ICs manufactured at least in the immediate vicinity of the test IC.

In various embodiments, test ICs 12A-12D may include a subset of the functionality of the product ICs for which their performance is being evaluated. The particular functions incorporated into the test ICs may include those thought or shown to be most susceptible to the effects of process variations, in one embodiment. For example, if the IC is a microprocessor IC, it may be determined that storage structures such as RAM arrays that may be used to implement a cache memory may be particularly sensitive to variations in a particular manufacturing process. Therefore, it may be desirable to incorporate a similar RAM array along with the means to exercise its functionality at its specified operating/clock speed into the test IC design.

Figure 2:
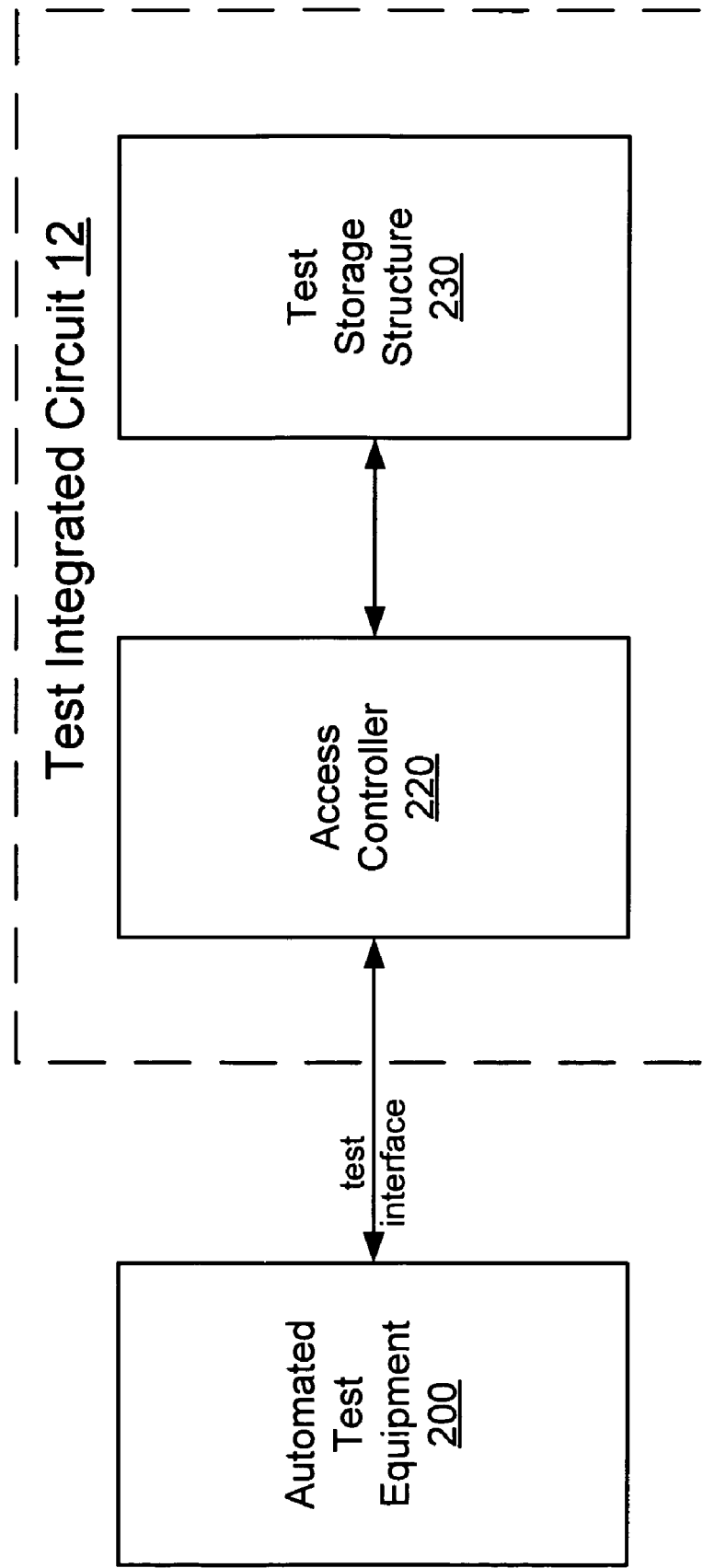
FIG. 2 illustrates one embodiment of the test integrated circuit of FIG. 1 coupled to automated test equipment.

Referring to FIG. 2, one embodiment of the test integrated circuit of FIG. 1 coupled to automated test equipment is illustrated. ATE 200 is coupled to a test IC 12, which includes an access controller 220 coupled to a test RAM 230. As described in greater detail below, the ATE may use a JTAG interface to load data indicative of test operation conditions into access controller 220 of test IC 12. Once loaded, the ATE may signal the access controller to begin testing the test RAM 230. When testing is finished, the ATE may use the JTAG interface to return the test results and other information from test IC 12.

The test RAM 230, as mentioned above, may in some embodiments replicate a RAM array included or embedded within the product ICs. In other cases the test RAM may be smaller or differ in other ways from the corresponding RAM array included in the product ICs. An important aspect in the design of the test IC may be that the test RAM functionality accurately reflects the functionality of the product IC RAM. It may be advantageous therefore, for access controller 220 to access the test RAM 230 in the same way and at clock speeds as may be used during normal operation of the product IC RAM.

Accordingly, as described above, ATE 200 may provide control signals to and receive test results from test IC 12 through one or more wafer probes. More particularly ATE 20 may provide control data to test IC 12. In one embodiment, access controller 220 may supply a clock and control information to test RAM 230. Access controller 220 may return the test results to ATE 220. In one embodiment, the test interface between the ATE and test IC 12 may comply with the widely used IEEE standard 1149, which is otherwise known as the JTAG interface. The JTAG interface uses five dedicated signals (e.g., TRST*, TCK, TMS, TDI and TDO), which are typically provided on each chip that supports the standard.

Figure 3:
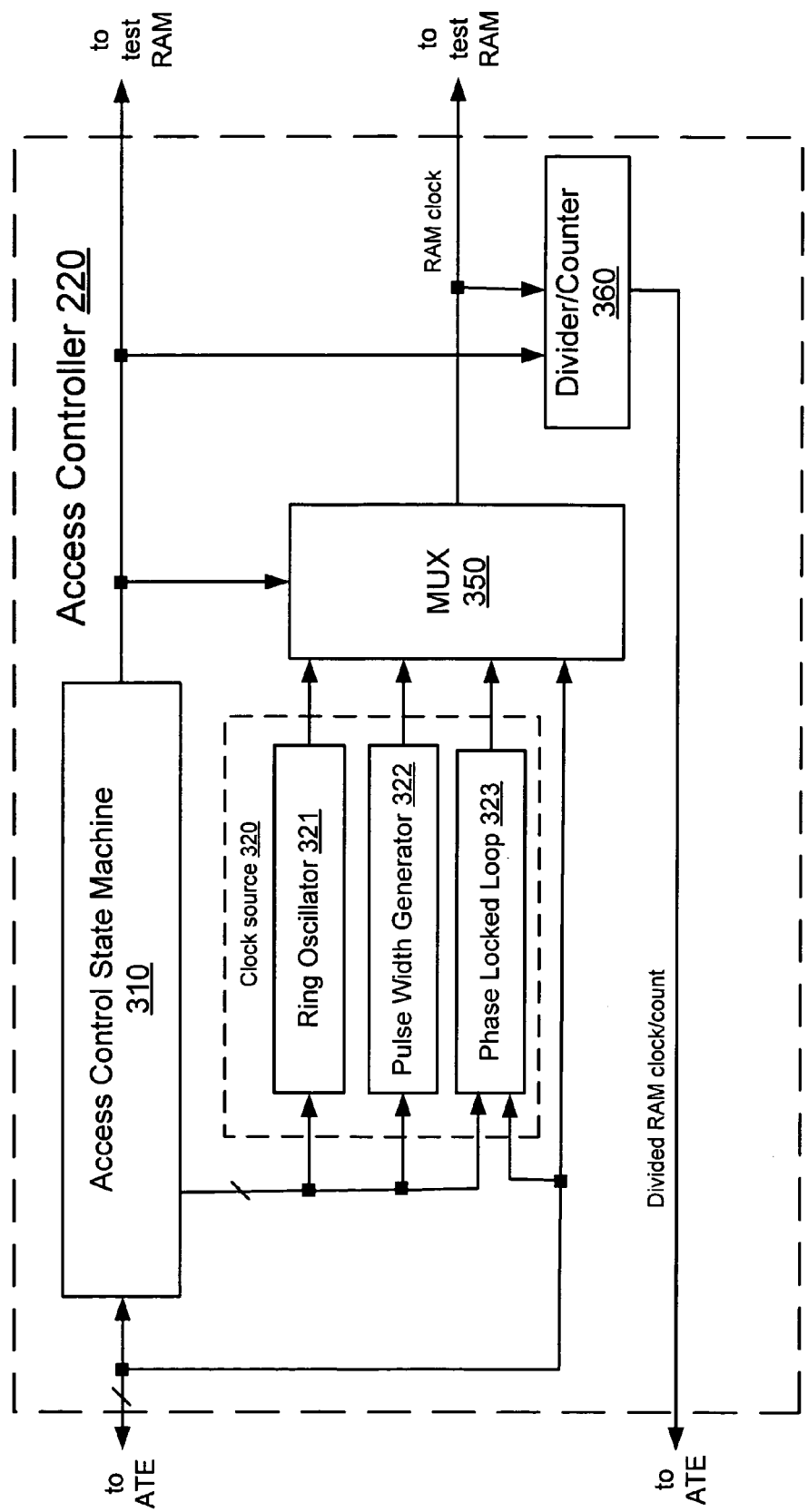
FIG. 3 shows various aspects of one embodiment of an access controller of the test integrated circuit of FIGS. 1 and 2.

FIG. 3 shows various aspects of one embodiment of an access controller of the test integrated circuit of FIGS. 1 and 2. Access control state machine 310 is coupled to multiplexer (MUX) 350, clock source 320 and divider/counter 360. Based on control signals supplied by access control state machine 310, MUX 350 may couple the output from a component of clock source 320 to divider/counter 360 and test RAM 230. In some embodiments, access control state machine 310, divider/counter 360 and MUX 350 may be coupled through a test interface to ATE 200.

In one embodiment, the access control state machine 310 may receive command, data, and/or clock signals from the ATE through the test interface. The access control state machine may provide control signals to the clock source 320. The control signals may set the frequency of the test RAM clock. In one embodiment, the frequency of the test RAM clock may be selected by controlling MUX 350. In another embodiment, the access control state machine 310 may select the source to be supplied to the test RAM by controlling enable signals to the individual clock sources. In one implementation, access control state machine 310 may include one or more registers (not shown) for storing information used to configure the access controller 220.

In one embodiment, access control state machine 310 may also provide data/control signals to the test RAM. For example, the access control state machine may receive commands from the ATE and in response, configure the test RAM for a particular operation (e.g. read, write, etc.) to be performed using supplied data. Thus, access controller 220 may produce address and control signals to the test RAM. Further, the access control state machine 310 may cause the test RAM to execute the configured access operation by selecting and supplying a RAM clock signal to the test RAM from one of the clock sources. In one embodiment, once the access has been performed, the access control state machine 310 may return the result data from the RAM access test to the ATE for analysis. In other embodiments, the access control state machine 310 may determine the results of the RAM access test and forward a pass/fail indication to the ATE. For example, the access control state machine 310 may include test data to be written to one or more locations in the test RAM. After writing the test data to the RAM locations, the access control state machine 310 may read the locations that it has written and compare the values read to the values that it wrote.

In the illustrated embodiment, clock source 320 includes multiple clock sources from which the access control state machine may selectively provide a RAM clock signal to the test RAM to enable accesses. As shown, the clock sources include on-chip clock generators as well as sources that require external input from the ATE. Various embodiments may include combinations of these types of sources or sources of only one type. For testing at clock speeds that can be generated by the ATE and successfully transferred through the probe interface to the test IC, the access control state machine 310 may selectively route the ATE clock signal to the test RAM. However, as noted above, the frequency of ATE clock signals may be limited and may not stress an IC designed to operate in the Gigahertz range. Thus for testing at higher frequencies, other clock sources may be selected.

To eliminate the dependency on an external clock source and to test the test RAM at speed, pulse width generator 322 may be selected as a source of the test RAM clock signal. In one embodiment, the pulse width generator 322 may be programmable to generate a pulse train clock signal at frequencies in the range of the specified operating frequency of the test RAM, and at various duty cycles. In one embodiment, the pulse width generator 322 may use values of resistance/capacitance to establish its base operating frequency. Since the exact values of resistors and capacitors manufactured on an IC may be susceptible to IC process variations, the operational frequency range of the pulse width generator may vary from one wafer to another.

Another clock source for the test RAM clock signal is ring oscillator 321. Ring oscillator 321, in its simplest form, may include a string of an odd number of inverters (not shown) whose output is coupled to its input in a feedback arrangement forming a ring. The ring oscillator 321 may be readily designed to produce frequencies in the range of the specified operating frequency of the test RAM. The exact frequency of oscillation of the ring oscillator may be dependent upon the intrinsic gate delay of the inverters comprising the ring. This gate delay may be dependent upon operating voltage and temperature as well as manufacturing process characteristics. Therefore, as with the pulse width generator, divider/counter 360 may be used to allow the ATE to determine the exact frequency of the clock signal being supplied to the test RAM. The simplicity and robustness of the ring oscillator design may allow it to operate through variations in manufacturing process characteristics that might preclude the operation of analog type clock generators. The output frequency of the ring oscillator may be made programmable by the inclusion of one or more selectable inter-stage delays into the ring or by adding a programmable division string to the output. The actual output frequency for a ring oscillator on a given wafer may be determined using the techniques described above in regard to the pulse width generator.

As described previously, the ATE may be operating with clocks that are orders of magnitude slower than the specified operational frequency of the test RAM. Therefore, the ATE may not be able to measure the precise test RAM clock frequency being generated by the pulse width generator 322. The divider/counter 360 may allow for indirect frequency measurements. For example, frequency divider/counter 360 may be used reduce the frequency of the RAM clock signal to a frequency that the ATE can measure directly. The divisor of the frequency divider may be programmable via the access control state machine 310. Accordingly, using the divisor value and a measurement of the frequency of the divided RAM clock signal, the ATE may determine the frequency of the clock signal provided to the test RAM. In another embodiment, the ATE may use a time interval measured by its internal clock and a count provided by divider/counter 360 to determine the RAM clock frequency. More particularly, at the beginning of this interval, the ATE may send a signal to the access controller to select the pulse width generator 322. The RAM clock may feed divider/counter 360. At the conclusion of the measured interval the ATE may send a command to the access control state machine 310 to stop the counter. The ATE may then read the count value from the test IC, and by knowing the duration of the time interval, may determine the frequency of the selected source.

In the illustrated embodiment, the PLL 323 may be any type of commonly used PLL, for example, PLL 323 may be an analog circuit including a phase detector, integrator voltage-controlled oscillator (VCO), frequency divider, and a delay unit (all of which are not shown). The VCO may be designed to operate in a range of frequencies around the specified operating frequency of the test RAM. As is the case for most PLLs, PLL 323 may synthesize a RAM clock signal at a frequency that is higher than the input ATE clock signal and phase-locked to the ATE clock signal. The RAM clock signal frequency may be several orders of magnitude higher than that of the clock signal supplied by the ATE. While allowing for testing at Test RAM operating frequencies, the function of the PLL is dependent upon the external clock signal from the ATE and its analog nature may make it sensitive to process variations.

Figure 4:
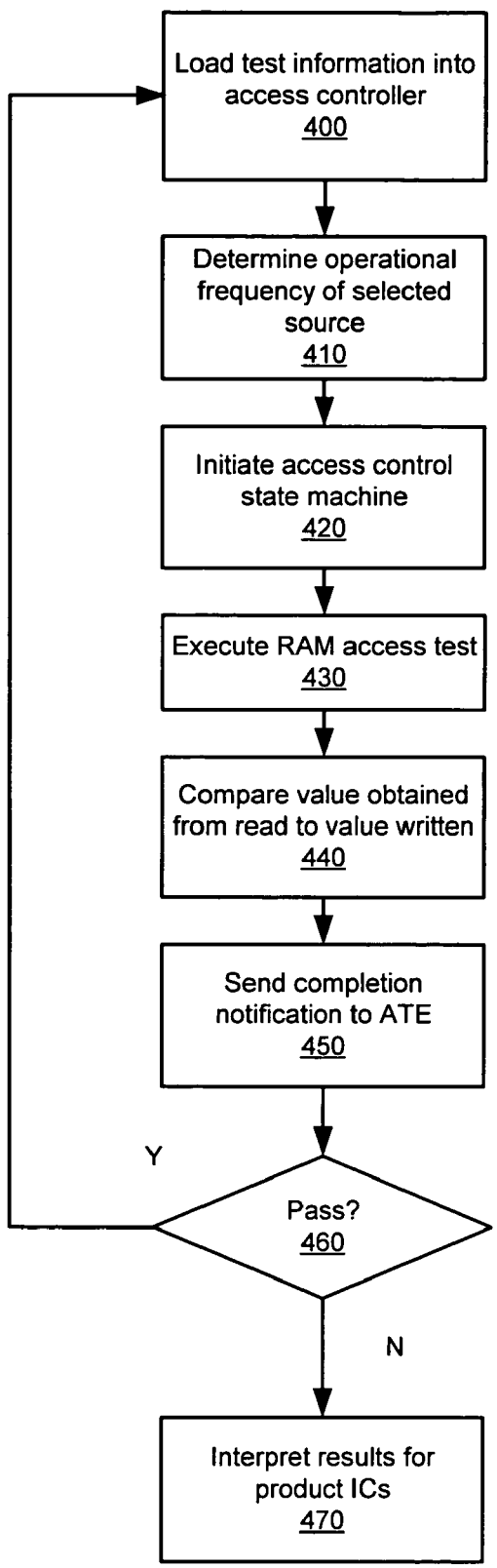
FIG. 4 is a flow diagram describing the operation of one embodiment of the test integrated circuit of FIGS. 1, 2 and 3.

FIG. 4 is a flow diagram describing the operation of one embodiment of the test integrated circuit of FIGS. 1, 2 and 3. Referring collectively to FIG. 1 through FIG. 4 and beginning in block 400, the ATE may load the access controller 220 with information needed to run a test RAM access test. In one embodiment, this information may include an indication of which clock source is to be used during the test along with a value for the particular frequency that the clock source 320 is to generate and a corresponding value for the frequency divider/counter 360. Additionally, the ATE may provide address and/or data to be used in accessing the test RAM and commands for the access control state machine 310. In one embodiment, this information may be transmitted serially from the ATE through the test interface and loaded into test registers within the access controller 220.

When the test information has been loaded into the access controller 220, access control state machine 310 may select a clock source to clock the test RAM. The ATE may determine the actual frequency of this source (block 410). In one embodiment, the ATE may measure the frequency of a frequency-divided version of the RAM test clock. In another embodiment the ATE may the frequency of the RAM test clock by starting and stopping a counter that is clocked by the RAM test clock over a measured period of time and then reading the number of cycles counted during the period from the counter.

Once the ATE determines the frequency of the selected clock source, the ATE may send a command to the access control state machine 310 to initiate the execution of the specified access test (block 420). In one embodiment, the ATE may suspend operations for a set period of time corresponding to the time needed for the access controller to perform the test. Alternatively, the ATE may enter a wait loop while polling for an indication that the test has completed. It is noticed that depending upon the ratio of the frequency of the RAM test clock signal to the ATE internal clock, the access test may execute at a speed several orders of magnitude faster than the ATE clock, and therefore from the perspective of the ATE the test results may be available as soon as the start execution command has been issued.

In response to a test initiation command from the ATE, the access control state machine 310 may provide command, address and data information to the test RAM synchronized with the clock signal from the selected clock source to execute the specified test (block 430). In one embodiment, the test may include writing data to a range of RAM addresses. The ATE may supply the starting address along with a data value to be written. The access control state machine 310 may send the starting address and data to the test ram and then send a write command to actually perform the access. Subsequently, the access control state machine may generate successive addresses based on the starting address and send a write command for each generated address. Thus multiple locations within the test RAM may be written with data during the execution of a single test. Additionally, the test may indeed read data from the multiple locations within the test RAM.

In some embodiments, the access control state machine may be configured to determine the success or failure of the RAM access test. For example, the access control state machine may write a data value to a specified address in the test RAM. The access control state machine 310 may perform a read operation to the same address and compare the read value to that which was previously written. Matching values may indicate that the access was performed successfully, while a mismatch may be indicative of an access failure and the access control state machine may make a record of such failures. In other embodiments, the access control state machine may write data values to one or more locations in the test RAM and then read the data from those locations into registers accessible by the ATE (block 440).

When the access control state machine has completed execution of the RAM test, it may send notification to the ATE that is indicative of the completion of the test (block 450). In one embodiment, this notification may include a pass/fail indication for the executed test. If desired, the ATE may access the registers within the access controller containing information corresponding to test operations that failed and/or failed data values. In other embodiments, the access control state machine 310 may not determine whether a test passes or fails but may store test results in designated registers that are accessible by the ATE. At the conclusion of test execution, the access control state machine 310 may send the completion notification to the ATE that indicates that the results are available. The ATE may shift the result values out of the designated registers to determine their validity.

The RAM testing may be repeated any number of times at various frequencies to determine an operational range for the test RAM structure, as described. For example, if the results of an access test indicate that the test RAM is functioning properly at a given frequency (block 460), then another iteration of the test may be run at a higher frequency and operation may proceed as discussed above in block 400. Similarly, if the results of a given iteration indicate that the test RAM is no longer functioning properly (block 460) the results of this iterative testing may be interpreted to yield an operational frequency range for the test RAM structure (block 470).

In one embodiment, the test RAM structure may replicate a RAM structure in the product IC and the operational frequency range thus determined, may be ascribed to the RAM structure of the product IC. In other embodiments, the test RAM structure may differ from a RAM structure in the product IC and the operational frequency range may need to be interpreted in light of the differences in order to estimate an operational frequency range for the RAM structure in the product IC. In embodiments where multiple test ICs are formed on a single wafer, the above testing process may be repeated for some or all of the test ICs. Test RAM access results may be used to predict the operational characteristics of microprocessor product ICs formed adjacent to the test ICs. This information may be used to pre-sort the product microprocessor IC die as to operating frequency prior to packaging. It may also be used to provide feedback on various manufacturing processes in order to increase product yield.

It is noted that although the foregoing describes test storage structures to be test RAM structures, it is contemplated that in other embodiments, the test storage structures may be any type of storages. For example, the test storage structures may be read only memory structures, register file structures and the like.

Numerous variations and modifications will become apparent to those skilled in the art once the above disclosure is fully appreciated. It is intended that the following claims be interpreted to embrace all such variations and modifications.

What is claimed is:

1. A test integrated circuit manufactured on a semiconductor wafer, the test integrated circuit comprising:
   a test storage structure; and
   an access controller coupled to the test storage structure and configured to access the test storage structure;
   wherein the access controller comprises a clock source comprising a pulse width generator configured to independently generate a clock signal for accessing the test storage structure;
   wherein the pulse width generator is configured to be programmable and configured to generate the clock signal as a pulse train at a number of frequencies;
   wherein the access controller is configured to internally store within one or more registers, test results of testing of the test storage structure; and
   wherein the one or more registers are accessible by automated test equipment configured to interpret the test results and to indicate functionality of another storage structure within another integrated circuit manufactured on the same semiconductor wafer as the test integrated circuit.

2. The test integrated circuit as recited in claim 1, wherein each of said number of given frequencies is higher than any frequency supplied by automated test equipment (ATE).

3. The test integrated circuit as recited in claim 1, wherein the pulse width generator is programmable and configured to generate the clock signal as a pulse train having a number of duty cycles.

4. The test integrated circuit as recited in claim 1, wherein the access controller is further configured to provide address and data signals for reading and writing the test storage structure in response to receiving one or more signals from automated test equipment.

5. The test integrated circuit as recited in claim 4, wherein the automated test equipment is configured to indicate functionality of other storage structures within other integrated circuits manufactured on the same semiconductor wafer based on the results from the reading and writing the test storage structure.

6. The test integrated circuit as recited in claim 5, wherein the test integrated circuit is formed in a location on the semiconductor wafer normally designated for one of the other integrated circuits.

7. The test integrated circuit as recited in claim 1, wherein the test integrated circuit is formed on the semiconductor wafer within one or more scribe lanes.

8. The test integrated circuit as recited in claim 1, wherein the test storage structure comprises a test random access memory (RAM) structure.

9. A test integrated circuit manufactured on a semiconductor wafer, the test integrated circuit comprising:
   a test storage structure comprising a test register file structure; and
   an access controller coupled to the test storage structure and configured to access the test storage structure;
   wherein the access controller comprises a clock source configured to independently generate a clock signal for accessing the test storage structure; wherein the clock source is configured to programmably generate the clock signal at a number of frequencies;
   wherein the access controller is configured to internally store within one or more registers, test results of testing of the test storage structure; and
   wherein the one or more registers are accessible by automated test equipment configured to interpret the test results and to indicate functionality of another storage structure within another integrated circuit manufactured on the same semiconductor wafer as the test integrated circuit.

10. The test integrated circuit as recited in claim 1, wherein the test storage structure comprises a test read only memory structure.

11. A method comprising:
    forming a test integrated circuit on a semiconductor wafer, wherein the test IC includes:
    a test storage structure;
    an access controller coupled to the test storage structure, wherein the access controller includes a clock source; and
    the access controller independently generating a clock signal to access the test storage structure; programmably generating the clock signal at a number of frequencies; and
    interpreting results of said accessing to indicate functionality of another storage structure within another integrated circuit manufactured on the same semiconductor wafer as the test integrated circuit.

12. The method as recited in claim 11, wherein each of said number of frequencies is higher than any frequency supplied by ATE.

13. The method as recited in claim 11, further comprising accessing data from the test storage structure in response to a signal provided by external automated test equipment.

14. The method as recited in claim 11, wherein the test storage structure comprises a test random access memory (RAM) structure.

15. A test system, comprising:
    automated test equipment; and
    a semiconductor wafer comprising a plurality of integrated circuits including one or more test integrated circuits;
    wherein the one or more test integrated circuits are located in positions on the semiconductor wafer normally designated for others of the integrated circuits, and wherein each of the one or more test integrated circuits includes:
    a test storage structure; and
    an access controller coupled to the test storage structure and configured to access the test storage structure;
    wherein the access controller comprises a clock source configured to independently generate a clock signal for accessing the test storage structure; and wherein the clock source is configured to programmably generate the clock signal at a number of frequencies, each of which is higher than any frequency supplied by the automated test equipment.

16. The test system as recited in claim 15, wherein the test storage structure comprises a test random access memory (RAM) structure.

* * * * *